(12) United States Patent
Schubert et al.

(10) Patent No.: US 7,772,938 B2
(45) Date of Patent: Aug. 10, 2010

(54) ELECTRICAL MULTIPLE-WIRE SYSTEM FOR PUSH-PULL SIGNAL TRANSMISSION WITH AN ATTENUATING OR FILTERING ELEMENT AND DATA TRANSMISSION BUS

(75) Inventors: Goeran Schubert, Nuremberg (DE); Thomas Fischer, Erlangen (DE)

(73) Assignee: Conti Temic microelectronic GmbH, Nuremberg (DE)

( * ) Notice: Subject to any disclaimer, the term of this patent is extended or adjusted under 35 U.S.C. 154(b) by 71 days.

(21) Appl. No.: 11/886,756

(22) PCT Filed: Mar. 6, 2006

(86) PCT No.: PCT/DE2006/000384

§ 371 (c)(1),
(2), (4) Date: Sep. 19, 2007

(87) PCT Pub. No.: WO2006/105747

PCT Pub. Date: Oct. 12, 2006

(65) Prior Publication Data

US 2009/0039975 A1    Feb. 12, 2009

(30) Foreign Application Priority Data

Apr. 7, 2005   (DE) .................. 10 2005 016 216

(51) Int. Cl.
*H01P 5/00* (2006.01)
*H01P 1/22* (2006.01)
*H01P 1/201* (2006.01)
(52) U.S. Cl. .................. 333/12; 333/81 R; 333/172; 333/175; 333/5

(58) Field of Classification Search .................. 333/1, 333/4, 5, 100, 118, 165–168, 172, 175, 185, 333/81 R, 12
See application file for complete search history.

(56) References Cited

U.S. PATENT DOCUMENTS

| 2,084,740 | A  | * | 6/1937  | McKesson ............... 455/114.1 |
| 4,620,166 | A  | * | 10/1986 | De Faveri et al. ........... 333/184 |
| 6,342,823 | B1 | * | 1/2002  | Dansky et al. .................. 333/1 |
| 6,856,165 | B2 | * | 2/2005  | Rall ............................ 326/30 |
| 6,944,435 | B2 | * | 9/2005  | Contopanagos et al. ..... 455/307 |
| 7,164,995 | B2 | * | 1/2007  | Pollock et al. ................ 702/57 |
| 2004/0135646 | A1 |  | 7/2004 | Rall |

FOREIGN PATENT DOCUMENTS

EP    1 345 323    9/2003

\* cited by examiner

*Primary Examiner*—Benny Lee
*Assistant Examiner*—Gerald Stevens
(74) *Attorney, Agent, or Firm*—W. F. Fasse; W. G. Fasse

(57) ABSTRACT

The electric multiple conductor system (1) is used for the transmission of signals in differential mode, and has two signal lines (5, 6) and a shared reference line (7). Each signal line (5, 6) includes an attenuation or filter element (13, 14) with a connection branch (15, 16), which runs between a branch node (20, 21) in the respective signal line (5, 6) and the reference line (7). The attenuation or filter elements (13, 14) of the respective signal lines (5, 6) are nominally of the same size. Each connection branch (15, 16) respectively includes a serial connection of a first partial branch (17, 18) having a first reactive impedance (23, 24) and a second partial branch (19) having a second reactive impedance (25). The second partial branch (19) is a shared component of all attenuation or filter elements (13, 14). The multiple conductor system (1) achieves a very high level of common mode suppression.

13 Claims, 3 Drawing Sheets

ELECTRICAL MULTIPLE-WIRE SYSTEM FOR PUSH-PULL SIGNAL TRANSMISSION WITH AN ATTENUATING OR FILTERING ELEMENT AND DATA TRANSMISSION BUS

FIELD OF THE INVENTION

The invention relates to an electrical multiple conductor system for the transmission of signals in differential mode with at least two signal lines and a shared reference line, whereby each signal line comprises an attenuation or filter element with a connection branch which runs between a branch node in the respective signal line and the reference line, and whereby the attenuation or filter elements of the respective signal lines are nominally of the same size. The invention also relates to a data transmission bus.

BACKGROUND INFORMATION

Multiple conductor systems of this type are used in a data transmission bus, for example. Typical fields of application are in data technology, installation technology and the automobile industry. Via the multiple conductor system, signals are transmitted from a transmitter to a receiver. The signals commonly comprise a common mode and a differential mode, whereby the information is in particular transported by means of the differential mode.

The attenuation or filter elements, which are arranged on the output and/or input side in each signal line serve to protect the connected transmitter or receiver against interferences which may be coupled into the multiple conductor system on the transmission paths. The attenuation or filter effect should be the same in every signal line, and in order not to distort the signal information transported in differential mode. The attenuation or filter elements are therefore constructed in the same design. However, unrequired over-coupling occurs from common mode to differential mode, the extent or rather the avoidance of which is determined by the common mode suppression (=common mode attenuation).

SUMMARY OF THE INVENTION

The object of the invention is to provide a multiple conductor system of the type described in the introduction, which comprises an improved common mode suppression as compared with the known multiple conductor systems.

In order to attain this object, a multiple conductor system is presented in accordance with the features of the present invention. It has been found that a significant proportion of the unrequired over-coupling from common mode to differential mode can be traced back to the tolerances of the construction elements used to realize the attenuation or filter elements. The attenuation or filter elements are usually frequency filters which are constructed using passive components. For example, an RC module is frequently used as a first order low pass. However, low passes of a higher order are just as possible as designs as band passes or high passes. Equally, a cascading of several frequency filters is possible. It has been shown that the capacitors and/or coils used to realize the reactive impedance comprise significantly higher tolerances as the ohmic resistances, so that the tolerance-related deviations in the capacity or inductivity values of the attenuation or filter elements play a key role in causing the over-coupling from common to differential mode.

According to the invention, the reactive impedance which is the decisive influence for the suppression of the common mode is dramatically reduced when an individual reactive impedance, namely the second reactive impedance which is arranged in the second partial branch is to the same degree a component of all the attenuation or filter elements. Since only one is provided, the tolerance of the second reactive impedance is irrelevant. The measure according to the invention of replacing the original reactive impedance which is provided in the connection branch of each attenuation or filter element with a serial connection with at least two reactive impedances, and of assigning one of these to all attenuation or filter elements as a basic reactive impedance, leads to a significant improvement, i.e. to an increase, in the suppression of the common mode.

The reactive impedances can preferably be designed either as capacities or as inductive resistors. Mixed forms consisting of combinations of both reactive impedance types are also possible. The selection of the reactive impedances depends on the frequency behavior required by the respective application. Depending on the design of the reactive impedances, the attenuation or filter elements behave like low pass, band pass or high pass filters, in principle with a random sequence.

With the first capacitance having a greater capacitance value than the second capacitance, and especially a capacitance value that is one decade or order of magnitude greater, the overall capacity or capacitance and also the overall tolerance of the serial connection is significantly determined by the smaller capacity, i.e. the second capacity or capacitance. Its tolerance is irrelevant, however, according to the explanation given below, since the second capacity is assigned to all attenuation or filter elements to the same degree.

The variant using an RC module with an ohmic resistance for the attenuation or filter element in the form of a low pass is particularly simple to construct.

The design variant in which the attenuation or filter element comprises a further ohmic resistance connected in the signal flow direction after the branch node into the signal line, wherein the resistances are arranged facing both sides of the branch node, improves stability above all with high frequencies. This applies in particular when the attenuation or filter elements are provided as an input connection for a differential amplifier.

The serial connection, in the first partial branch, of a first attenuating ohmic resistance to the first capacitance reduces the quality in differential mode and also regressively in common mode, so that the vibration curve and therefore the formation of unrequired current or voltage peaks is reduced.

The parallel connection, in the second partial branch, of a second attenuating ohmic resistance to the first capacitance reduces the quality in common mode and leads in particular in the lower frequency range to an increase in common mode attenuation.

A further object of the invention is to provide a data transmission bus, the multiple conductor system of which comprises a better suppression of the common mode than the known multiple conductor systems.

This object is attained according to the invention by a data transmission bus including an inventive multiple conductor system. With the data transmission bus according to the invention, essentially the same advantages result as those which have already been described above in connection with the multiple conductor system according to the invention.

With the designs of the data transmission bus of the invention as a CAN bus or as a FlexRay™ bus, the data is transmitted in differential mode, so that the multiple conductor system according to the invention can be used to particular great advantage with the advantageous common mode suppression.

BRIEF DESCRIPTION OF THE DRAWINGS

Further features, advantages and details of the invention will now be described below with references to exemplary embodiments and the drawing, in which.

DETAILED DESCRIPTION OF EXAMPLE EMBODIMENTS OF THE INVENTION

Figure 1:
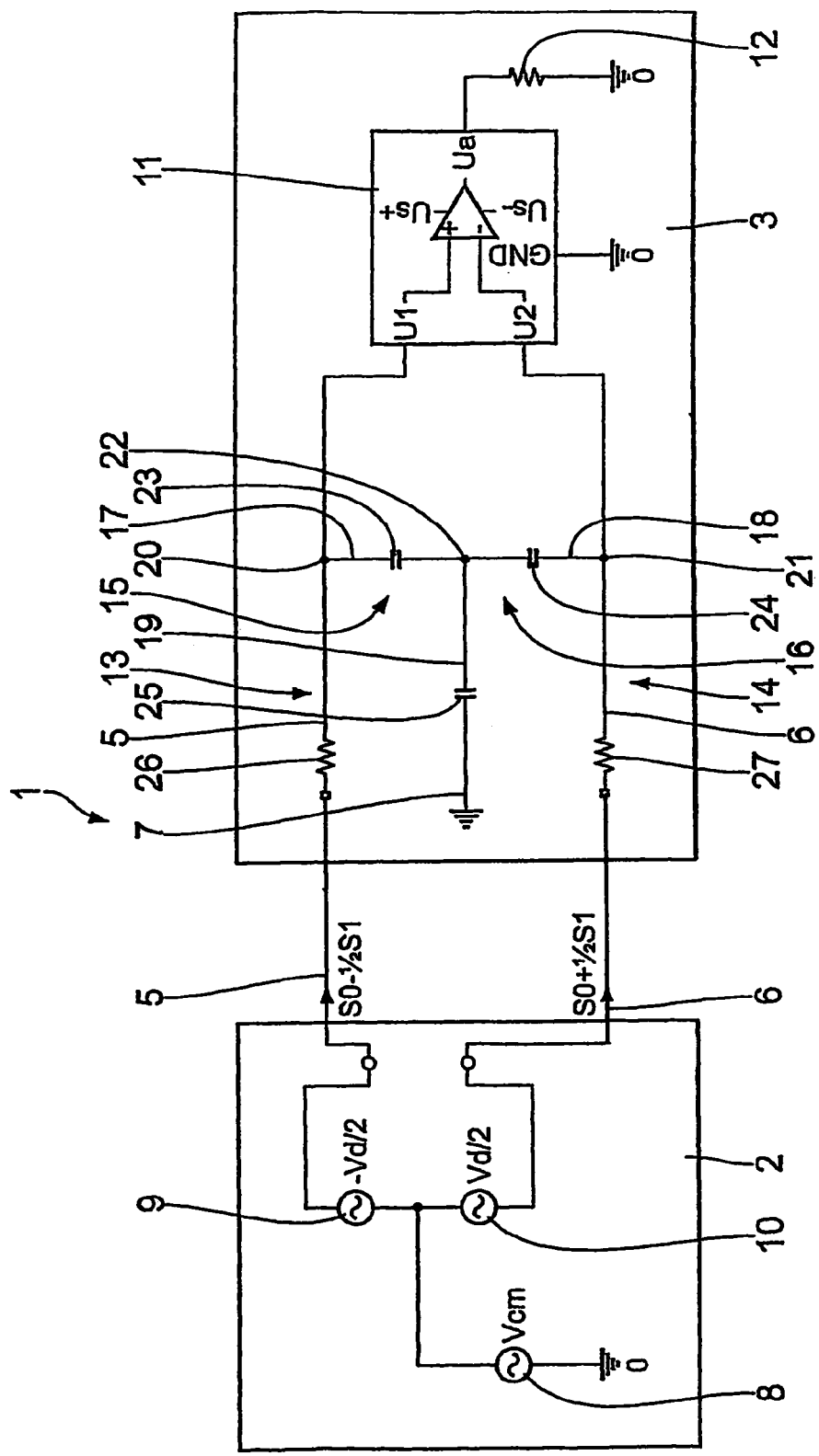
FIG. 1 shows an exemplary embodiment of a multiple conductor system with attenuation or filter elements.

Parts which correspond with each other in FIGS. 1 to 4 are assigned the same reference numerals.

FIG. 1 shows an exemplary embodiment of an electric multiple conductor system 1 for signal transmission, to which at least one signal or data source 2 is connected, e.g. in the form of a transmitter, and a data receiving terminal is connected in the form of a receiver 3. The multiple conductor system 1 contains three lines, namely two signal lines 5 and 6 and a shared reference line, which in the exemplary embodiment is designed as an earth line 7. In general, more than two signal lines can be provided; connection contacts to a shared reference potential, for example to the earth potential, which are located at different points in the multiple conductor system, can also be provided instead of the reference line.

The signal or data source 2 is only shown schematically and as a highly simplified equivalent circuit diagram with a common mode voltage source 8 which provides a common mode signal Vcm, and two differential mode voltage sources 9 and 10 which aside from the polarity each deliver an identical differential mode signal Vd/2, and of which one of connected to the first signal line 5 and the other is connected to the second signal line 6. By contrast, the common mode voltage source 8 feeds both signal lines 5 and 6. The signal or data source 2 is to be understood in general terms. It is not bound to a specific location within the multiple conductor system 1. To a far greater extent, it can theoretically be positioned at any point at which a signal is disseminated within the multiple conductor system 1, i.e. in particular, also directly on the input of the receiver 3.

The receiver 3 also contains, alongside a schematically shown differential amplifier 11 and a load 12 which is connected on the output side to the differential amplifier 11, two attenuation or filter elements in the form of low passes 13 and 14, of which one is in each case connected on the input side of the differential amplifier 11 to the signal line 5 or 6. The low passes 13 and 14 which are essentially structured as RC modules, are components of the multiple conductor system 1. In general, further, comparable low passes can also be provided at another point in the multiple conductor system 1, for example on the output side of the signal or data source 2.

In each case, the low passes 13 and 14 have a connection branch 15 or 16 which runs between the respective signal line 5 or 6 and the earth line 7, which is comprised of a serial connection of a specific partial branch 17 or 18 and a shared partial branch 19. The specific partial branches 17 and 18 are connected to the signal lines 5 or 6 by means of branch nodes 20 or 21, and flow into a shared star point 22, from which the shared partial branch 19 runs to the earth line 7. In the specific partial branches 17 and 18, specific capacities 23 or 24 are arranged with nominally equal capacity values. The shared partial branch 19 comprises a shared capacity 25. The low passes 13 and 14 furthermore each contain an ohmic longitudinal resistance 26 or 27, in the signal flow direction is connected before the branch node 20 or 21 to the signal line 5 or 6. The longitudinal resistances 26 and 27 nominally have the same resistance value, so that the low passes 13 and 14 are in general of the same size.

The functionality of the multiple conductor system 1, and in particular, the low passes 13 and 14, will now be described in greater detail.

With the multiple conductor system 1, the information is transmitted in differential mode. This means that a data signal S1 to be transmitted is divided equally between the two signal lines 5 and 6, so that a partial data signal −½S1 is fed in one signal line 5, and a partial data signal ½S1 is fed in the other signal line 6. In signal lines 5 and 6, an identical common mode signal S0 is overlaid, which contains no information content.

The data signal S1 (=differential mode signal) and the common mode signal S0 can in each case be present both as a DC and as an AC signal, whereby both signals S0 and S1 can certainly also be within the same frequency range.

The common mode signal S0 can here be determined in particular by the (DC) operating voltage. When used in the automobile industry, this is the potential provided by the car battery, i.e. 12V or 24V. However, an alternating potential is also possible with an amplitude value in the lower V range, e.g. 1V. By contrast, the level of the data signal S1 is frequently significantly lower. Its amplitude value lies in particular only in the mV range, e.g. at 200 mV. Overall, a high common mode potential on the signal lines 5 and 6 can be tapped, as can a low differential mode potential which overlays this.

In order to extract the information content of the data signal S1 on the receiver side, the levels which can be tapped on the signal lines 5 and 6 are fed to the differential amplifier 11. The common mode signal S0 which contains no information is eliminated as a result of the difference formation. By contrast, the partial data signals are added to the required data signal S1.

The low passes 13 and 14 which are upstream of the differential amplifier restrict the frequency content in accordance with the functional range. As a result, the components of the receiver 3 which follow are protected from interferences which are coupled with the signal lines 5 and 6. In addition, the frequency restriction avoids unwanted interference effects in the differential amplifier 11.

The principle of differential mode transmission is based on partial data signals |½S1| which are of precisely the same value in the two signal lines 5 and 6. Any deviation from this may lead to a loss of information and/or data. For this reason, the signal lines 5 and 6, together with all connected components, as well as the low passes 13 and 14, are designed in the same manner.

Even when construction elements of the same type are used, i.e. with nominally the same dimensions, slightly different transmission behaviour in the signal lines 5 and 6 may occur as a result of the continuously present construction element tolerances. Here, a partial overcoupling can also occur between common and differential mode, as a result of which it may only be possible to partially retrieve the data signal S1 in the receiver 3. This unrequired common mode-differential mode transformation is above all to be observed with a high common mode potential.

If low passes are formed taking conventional RC modules as a basis, which in contrast to the embodiments according to FIG. 1 in each case have a direct connection branch to the earth line 7, which comprises only one single capacity, significant over-couplings occur due to the construction element tolerances. These can be determined from the transmission function of an ideal RC module as follows:

$$H_1(\omega) = \frac{U_{off}}{U_{on}} = \frac{1}{\left(\frac{j\omega}{\omega_g} + 1\right)} \quad (1)$$

and on the basis of a tolerance-loaded RC module as follows:

$$H_2(\omega, Tol_R, Tol_C) = \frac{U_{off}}{U_{on}} = \frac{1}{\frac{j\omega}{\omega_g}\left(\frac{1 + Tol_R + Tol_C +}{Tol_R Tol_C}\right) + 1} \quad (2)$$

Whereby with:

$$\omega_g = 2\pi f_g = \frac{1}{RC} \quad (3)$$

reference is made to the square circle frequency, with $f_g$ to the cut-off or limit frequency, with R to the nominal resistance value of the longitudinal resistances 26 or 27, with C to the nominal capacity value of the transverse capacity in the connection branch to the earth line 7, and with $Tol_R$ and $Tol_C$ the tolerance of the resistances or the capacities.

The ceramic capacitors generally used in the automobile industry in order to produce a capacity have a tolerance TolC of 10%. By contrast, resistances with a significantly lower tolerance are available at affordable prices. When resistances of an adjusted array are used, a tolerance $Tol_R$ of 0.1% can be achieved. As a result, the tolerance-related over-coupling into differential mode is caused primarily by the capacitors. In the worst case, each construction element is on the edge of the tolerance interval, and the individual tolerances are overlaid additively, so that it can be assumed that an overall tolerance of approximately 20% is reached. The two conventional RC modules which are still the subject of discussion here have a total of two resistances and two capacities, whereby the tolerances of the resistances are practically negligible as opposed to those of the capacities.

An analysis of the equations (1) and (2) over the frequency $f=\omega/2\pi$ shows that the greatest deviation and therefore, the greatest degree of over-coupling, occurs in differential mode in the range of the limit frequency $f_g$. The maximum attainable attenuation or suppression of the differential mode portion which is transformed from the common mode signal S0 is therefore determined by the value with the limit frequency $f_g$. This attenuation, which is also described as common mode suppression, can be determined as follows:

$$|H_2(\omega=\omega_g,+Tol_C)-H_2(\omega=\omega_g,-Tol_C)| \quad (4)$$

On the assumption that the above tolerance values for $Tol_C$ are present, it is only 20 dB, for example. This is too little for many applications, including the automobile industry. The standards of precision for the control circuits used are far stricter in this field, and correspondingly lead to the requirement for greater common mode suppression of over 50 dB in particular.

If one takes these stricter standards of precision as a basis, with the equations (2) and (4) a maximum permitted total tolerance results of 0.3%, which is divided between the resistance tolerance of 0.1% and the overall capacitor tolerance of 0.2%. This condition cannot be met with conventional RC modules and commonly used capacitors. As has been mentioned above, an overall tolerance of approximately 20% would result.

For this reason, the multiple conductor system 1 according to FIG. 1 uses the low passes 13 and 14 instead of conventional RC modules. In particular, the connection branches 15 and 16 to the earth line 7 are designed differently than the solution with conventional RC modules. Instead of a capacity, in each case, a serial connection of the specific capacity 23 or 24 and the shared capacity 25 is provided. This results in a star connection of the capacities 23, 24 and 25 with reference to the star point 22. The low passes 13 and 14 are interconnected to an RC star filter in this manner.

If two capacities are switched in sequence, the capacity with the lower capacity value is dominant. As a result, the influence of the tolerance of the capacitor with the larger capacity value also decreases to the same degree that its influence on the overall capacity of the serial connection decreases. With the interconnection of the capacities 23 to 25 in accordance with FIG. 1, the overall capacity $C_G$ nominally results at:

$$C_G = \frac{\frac{1}{2}C_1 C_2}{\frac{1}{2}C_1 + C_2} \quad (5)$$

whereby $C_1$ is the nominal capacity value of the shared capacity 25, and $C_2$ is the nominal capacity value of the specific capacity 23 or 24.

If one also takes the overall capacity $C_G$ in the form of a nominal value which is loaded with a tolerance $\delta$, the following results:

$$C_G(1 + \delta) = \frac{\frac{1}{2}C_1(C_2 + \Delta C_2)}{\frac{1}{2}C_1 + C_2 + \Delta C_2} \quad (6)$$

whereby $\Delta$ is the tolerance of the specific capacity 23 or 24. When a capacity factor $n=C_2/C_1$ is introduced, which indicates the value difference between the capacities 23 and 24 on the one hand and 25 on the other, the tolerance $\delta$ is calculated as:

$$\delta = \frac{\Delta}{1 + 2n(1 + \Delta)} \quad (7)$$

If the specific capacities 23 and 24 are significantly greater than the shared capacity 25, i.e. $n \gg 1$, the following ratio can be derived from the equation (7) for the capacity factor:

$$n \approx \frac{\Delta}{2\delta} \quad (8)$$

According to equation (8), the capacity factor n depends in a good proximity solely on the tolerance $\Delta$ of the capacitor with the larger capacitor value and on the tolerance δ of the serial arrangement of the two capacities 23 or 24 and 25.

The tolerance of the capacitor used to realise the lower-value shared capacity 25 can by contrast be ignored. This can also be explained using plausibility considerations. The capacity 25 creates in both signal lines 5 and 6 a displacement to an equal degree of the limit frequency $f_g$ of the low passes 13 or 14, so that this tolerance does not contribute to the common mode-differential mode transformation.

With the specification named above of 0.2% for the overall capacity tolerance, which is related to the field of application, as a tolerance δ of the serial arrangement, and with the standard 10% tolerance for ceramic capacitors as a tolerance Δ of the higher-value capacitor, a value difference is calculated from equation (8) between the specific capacities 23 or 24 on the one hand and the shared capacity 25 on the other of at least two orders of magnitude, i.e. n≧25.

Otherwise, the construction elements of the low passes 13 and 14 are dimensioned on the basis of the specifications for the limit frequency $f_g$. The low passes 13 and 14 do not only attenuate the common mode portion, but also the differential mode portion. For both cases, different limit frequencies $f_{g\,common\,mode}$ or $f_{g\,differential\,mode}$ results, however, which are linked to each other as follows:

$$f_{g\,differential\,mode} = \frac{f_{g\,common\,mode}}{2n} \quad (9)$$

For n>>1, the common mode limit frewquency $f_{g\,common\,mode}$ is given as:

$$f_{g\,common\,mode} = \frac{1}{2\pi R C_1} \quad (10)$$

In practise, the differential mode limit frequency $f_{g\,differential\,mode}$ is first determined in accordance with the functional standards for example in the receiver 3. Then, with the incorporation of the required common mode suppression, the common mode limit frequency $f_{g\,common\,mode}$ is determined in accordance with equation (8) and (9), in order to then complete the dimensioning, taking into account equation (10).

Overall, a high level of common mode suppression is achieved with the low passes 13 and 14, even when the capacities 23 to 25 are realised with the standard tolerance-loaded capacitors.

Figure 2:
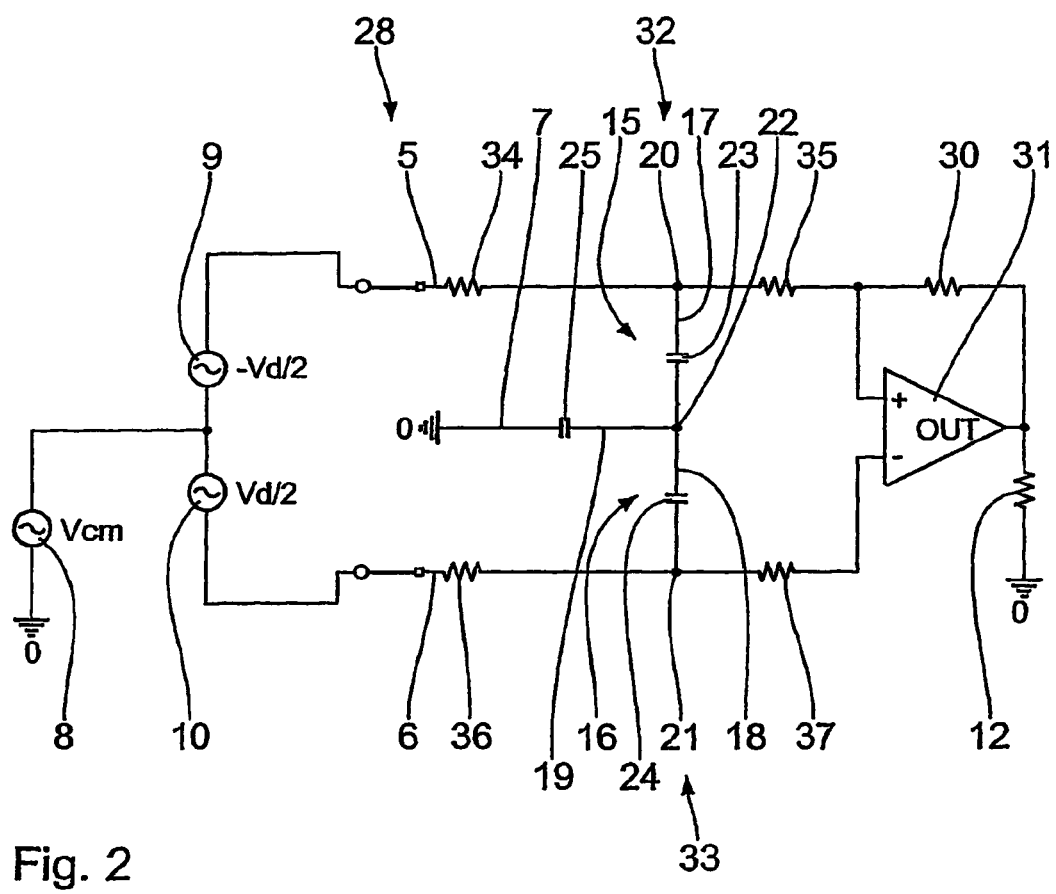
FIG. 2 shows a second exemplary embodiment of a multiple conductor system with modified attenuation or filter elements.

FIG. 2 shows a further exemplary embodiment of a slightly modified multiple conductor system 28, which is at the same time a triple conductor system. There are only a small number of differences between this embodiment and the exemplary embodiment shown in FIG. 1. With the exemplary embodiment shown in FIG. 2, the differential amplifier 11 which is shown only schematically in FIG. 1, is replaced by a specific realisation as an operational amplifier 31 which is regenerated via a regeneration resistance 30.

The low passes 32 or 33 which are connected as attenuation or filter elements on the input side of the operational amplifier 31 into the signal line 5 and 6 are only slightly modified as compared with the low passes 13 or 14. The ohmic longitudinal resistances 26 and 27 are divided with the low passes 32 or 33 into two separate ohmic longitudinal resistances 34 and 35 or 36 and 37, of which in each case one is arranged before the branch nodes 20 or 21 in the direction of the signal flow, and the other is arranged behind them in the direction of the signal flow. This division results in a restriction of the amplification with high frequencies, and thus increases the stability of the multiple conductor system 28. The attenuation behaviour and in particular, the advantageous common mode suppression are not altered significantly by the division of the resistance.

Figure 3:
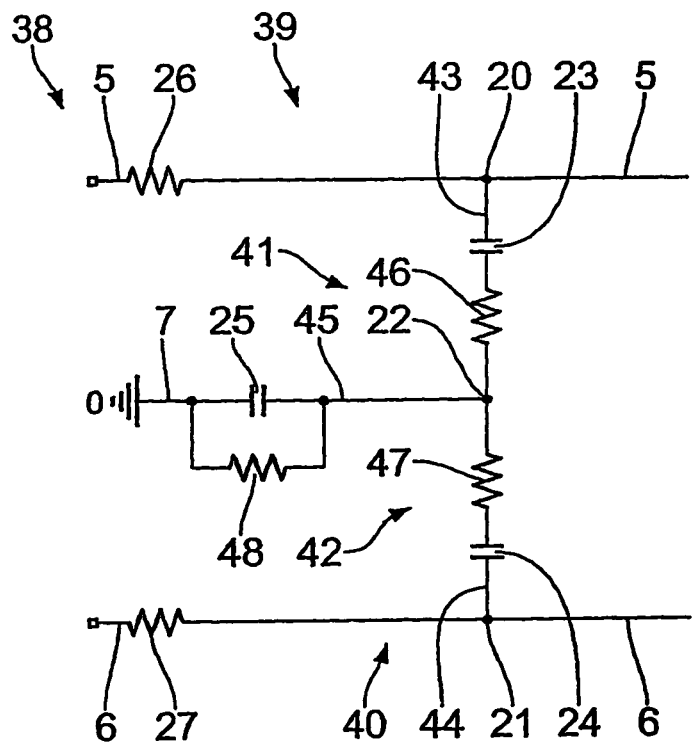
FIG. 3 shows a third exemplary embodiment of a multiple conductor system with modified attenuation or filter elements.

A further exemplary embodiment of a triple conductor multiple conductor system 38 is shown in FIG. 3. Low passes 39 and 40 are provided as attenuation or filter elements, which are modifications of the low passes 13 or 14.

However, in each case, the low passes 39 and 40 also have a connection branch 41 or 42 which runs between the respective signal line 5 or 6 and the earth line 7, which is comprised of a serial connection of a specific partial branch 43 or 44 and a shared partial branch 45. In each of the specific partial branches 43 and 44, an attenuating ohmic resistance 46 or 47 is connected series to the specific capacity 23 or 24. The resistances 46 and 47 have the same nominal resistance value. In the shared partial branch 45, an attenuating ohmic resistance 48 is connected in parallel with the shared capacity 25. The resistances 46 to 48 which are also provided attenuate the quality of the resonances which are formed, and thus restrict excess voltage or current levels. This advantageous effect can be achieved in both common mode and differential mode. This also applies in particular to an alternative embodiment, which is not shown, in which the purely ohmic longitudinal resistances 26 and 27 are replaced by EMV ferrite or inductive resistors.

Figure 4:
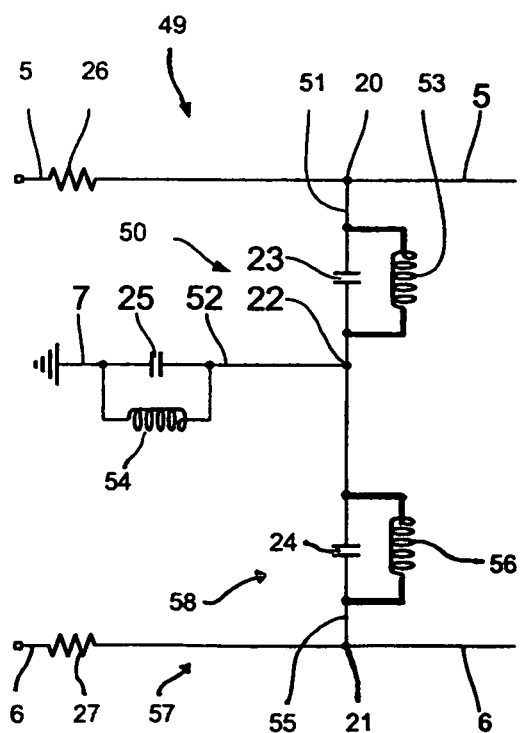
FIG. 4 shows a further exemplary embodiment of a modified attenuation or filter element.

FIG. 4 shows a further exemplary embodiment of two respective attenuation or filter elements 49 and 57, which in contrast to the previous exemplary embodiments are designed as a band pass, rather than a low pass. Each of these attenuation or filter elements 49 and 57 respectively in turn comprises a respective connection branch 50 or 58 which runs between the respective signal line 5 or 6 and the earth line 7, and which is respectively composed of a serial connection of a specific partial branch 51 or 55 respectively, and a shared partial branch 52. In the specific partial branch 51, a specific inductive resistor 53 is connected in parallel to the specific capacity 23, so that overall, a combined specific reactive impedance results. In the specific partial branch 55, a specific inductive resistor 56 is connected in parallel to the specific capacity 24, so that overall, a combined specific reactive impedance results. In the shared partial branch 52, a shared inductive resistor 54 is connected in parallel to the shared capacity 25, so that overall, a combined shared reactive impedance results.

As a result of the inductive resistors 53, 56 and 54 which are also provided, a low-ohmic connection to the earth line 7 is available for low frequencies. The result overall is band pass behavior. The possible tolerances given above for the capacities can be transferred analogously to the inductive resistors 53, 56 and 54, whereby the specific inductive resistor 53 or 56 respectively has a lower nominal inductance value than the shared inductive resistor 54. This division between the two partial branches 51 and 52 as well as 55 and 52 also leads here to an improvement in common mode suppression when, as has been described in connection with the multiple conductor systems 1, 28 and 38, in each case, one attenuation or filter element of the attenuation or filter element type 49 and 57 is inserted respectively into each of the signal lines 5 and 6 as shown in FIG. 4.

Furthermore, an exemplary embodiment which is not shown is also possible, in which the attenuation or filter element is designed as a pure high pass, and in the partial branches, only inductive reactive impedances are provided accordingly.

All of the exemplary embodiments described above can be used for different applications. For example, it is possible to use them for measuring the current for high common mode potential, whereby a drop in voltage in differential mode which results from a measuring shunt is determined by means of a downstream differential amplifier. A further field of application relates to data bus technology. There are numerous data transmission buses which use a triple conductor system, and with which the information is transmitted in differential mode, so that one of the multiple conductor systems 1, 28 and 38 can be used directly and with the advantages described above. Examples of this are the CAN bus and the Flex Ray bus.

The invention claimed is:

1. An electric multiple conductor system for signal transmission in differential mode, comprising at least two signal lines (5, 6) and a shared reference line (7), wherein
   a) each signal line (5, 6) respectively comprises a respective attenuation or filter element (13, 14; 32, 33; 39, 40; 49) with a respective connection branch (15, 16; 41, 42), which runs between a branch node (20, 21) in the respective signal line (5, 6) and the reference line (7)
   b) the respective attenuation or filter elements (13, 14; 32, 33; 39, 40; 49) of the respective signal lines (5, 6) are nominally dimensioned the same
   c) the respective connection branch (15, 16; 41, 42) of each respective attenuation or filter element (13, 14; 32, 33; 39, 40; 49) comprises a serial connection of a respective first partial branch (17, 18; 43, 44) and a shared second partial branch (19; 45; 52), wherein each respective first partial branch respectively includes a respective first reactive impedance, and wherein the shared second partial branch includes a second reactive impedance
   d) the shared second partial branch (19; 45) is a shared component of all of the attenuation or filter elements (13, 14; 32, 33; 39, 40; 49)
   e) each respective first reactive impedance comprises a respective first capacitance (23, 24), and the second reactive impedance comprises a second capacitance (25), and
   f) each respective first capacitance has a respective capacitance value greater than a capacitance value of the second capacitance.

2. A multiple conductor system according to claim 1, characterized in that each respective attenuation or filter element (13, 14; 32, 33; 39, 40) respectively comprises a respective RC module including a respective ohmic resistance (26, 27; 34, 36) which is connected into the respective signal line (5, 6) of the respective attenuation or filter element in the signal flow direction before the respective branch node (20, 21) of the respective signal line.

3. A multiple conductor system according to claim 1, characterized in that each respective first partial branch (43, 44) respectively further includes a respective attenuating ohmic resistance (46, 47), which is connected in series to the respective first capacitance (23, 24).

4. A multiple conductor system according to claim 1, characterized in that the shared second partial branch (45) further includes an attenuating ohmic resistance (48), which is connected in parallel to the second capacitance (25).

5. A data transmission bus comprising
   a multiple conductor system (1; 28; 38) according to claim 1.

6. A multiple conductor system according to claim 1, wherein the respective capacitance value of each respective first capacitance is at least one order of magnitude greater than the capacitance value of the second capacitance.

7. A multiple conductor system according to claim 1, characterized in that each respective first reactive impedance further comprises a first inductance (53) connected parallel to the respective first capacitance, and the second reactive impedance further comprises a second inductance (54) connected parallel to the second capacitance.

8. A multiple conductor system according to claim 1, wherein further:
   g) each respective attenuation or filter element (13, 14; 32, 33; 39, 40) respectively comprises a respective RC module including a respective ohmic resistance (26, 27; 34, 36) which is connected into the respective signal line (5, 6) of the respective attenuation or filter element in the signal flow direction before the respective branch node (20, 21) of the respective signal line, and
   h) each respective attenuation or filter element (32, 33) respectively further comprises a further ohmic resistance (35, 37) which is connected into the respective signal line (5, 6) of the respective attenuation or filter element in the signal flow direction after the respective branch node (20, 21) of the respective signal line.

9. A multiple conductor system according to claim 2, characterized in that each respective attenuation or filter element (32, 33) respectively further comprises a further ohmic resistance (35, 37) which is connected into the respective signal line (5, 6) of the respective attenuation or filter element in the signal flow direction after the respective branch node (20, 21) of the respective signal line.

10. An electric multiple conductor system for signal transmission in differential mode, comprising
   a first signal line;
   a second signal line;
   a shared reference line;
   a shared branch that connects a shared junction node to the shared reference line, and that includes a shared reactive impedance comprising a shared branch capacitance;
   a first branch node interposed in the first signal line;
   a second branch node interposed in the second signal line;
   a first branch that connects the first branch node to the shared junction node, and that includes a first branch reactive impedance comprising a first branch capacitance; and
   a second branch that connects the second branch node to the shared junction node, and that includes a second branch reactive impedance comprising a second branch capacitance;
   wherein:
   the first branch capacitance and the second branch capacitance both respectively have nominally the same capacitance value; and
   the capacitance value of the first branch capacitance and of the second branch capacitance is greater than a capacitance value of the shared branch capacitance.

11. The electric multiple conductor system according to claim 10, wherein the capacitance value of the first branch capacitance and of the second branch capacitance is at least one order of magnitude greater than the capacitance value of the shared branch capacitance.

12. The electric multiple conductor system according to claim 10, further comprising two ohmic resistances interposed in the first signal line respectively on opposite sides of the first branch node, and two ohmic resistances interposed in the second signal line respectively on opposite sides of the second branch node.

13. The electric multiple conductor system according to claim 12, wherein the shared reactive impedance further comprises a shared branch inductance, the first branch reactive impedance further comprises a first branch inductance, and the second branch reactive impedance further comprises a second branch inductance.

* * * * *